Figure 1:
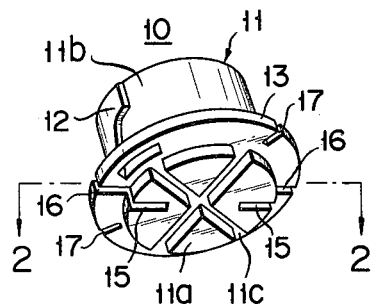

United States Patent [19]

Baba et al.

[11] 4,299,430
[45] Nov. 10, 1981

[54] LAMP HOLDER FOR BASELESS LAMP

[75] Inventors: Masaharu Baba, Yokohama; Kiyokazu Honda, Zushi; Yoshiji Yoshiike, Imabari; Akiyoshi Hashima, Yokohama, all of Japan

[73] Assignee: Tokyo Shibaura Denki Kabushiki Kaisha, Kawasaki, Japan

[21] Appl. No.: 86,665

[22] Filed: Oct. 19, 1979

[30] Foreign Application Priority Data

Oct. 23, 1978 [JP] Japan .................................. 53-129459
Oct. 23, 1978 [JP] Japan .................................. 53-129461

[51] Int. Cl.³ ............................................. H01R 9/09
[52] U.S. Cl. ................................................. 339/17 D
[58] Field of Search ............ 339/17 D, 125 L, 127 R, 339/127 C

[56] References Cited

U.S. PATENT DOCUMENTS 4,193,653  3/1980  Alzawa ............................. 339/17 D Primary Examiner—Neil Abrams
Attorney, Agent, or Firm—Cushman, Darby & Cushman

[57] ABSTRACT

A socket for electrically and mechanically connecting a baseless lamp comprises a cylindrical main body having a peripheral wall and, a bottom wall to receive said one end of said lamp, engaging segments and an insulating engaging flange protruding from the outer periphery of the peripheral wall of the main body and capable of holding a printed wiring board therebetween, a groove and slot assembly for leading out lead wires of the lamp with one end inserted in the main body from the main body through said bottom wall and fixedly holding part of said lead wires on a surface of said engaging flange which faces said engaging segments.

5 Claims, 9 Drawing Figures

LAMP HOLDER FOR BASELESS LAMP

This invention relates to a socket or lamp holder for fixing a baseless lamp to a substrate having electric wiring such as printed wiring board so that lead wires of the lamp may be electrically connected with the wiring.

Known sockets for baseless lamps are fixed to a substrate by holding it between an engaging flange and an engaging segment arranged around a cylindrical main body at a predetermined space from each other. The cylindrical main body is provided with first contacts to be brought in electrical contact with lead wires of a baseless lamp, and second contacts to be brought in electrical contact with the wiring of the substrate when the socket is attached to the substrate, whereby the lead wires of the baseless lamp are electrically connected with the wiring of the substrate. The first and second contacts are integrally formed of metal pieces, and fixed to the main body.

In the prior art sockets of the aforementioned construction, the metal pieces forming the contacts, as well as the interior of the main body to be fitted with the metal pieces and the lamp, must be complex in shape, complicating the manufacture and assembly of the sockets. Further, in setting the lamp, good electrical contact should be required of two positions; contact points between the first contacts and the lead wires of the lamp and between the second contacts and the substrate wiring. Thus, special care would be required for the shape, material and handling of the contacts, and there would possibly be caused defective contact due to impacts occurring after the setting.

Accordingly, the object of this invention is to provide a socket or lamp holder capable of easy manufacture and assembly, as well as of fixing a baseless lamp or bulb to a substrate, minimizing any possibility of a defective contact occurring between the wiring of the substrate and lead wires of the bulb during or after attaching the socket to the substrate.

According to an aspect of this invention, there is provided a socket for electricaly and mechanically connecting a baseless lamp having lead wires extending outward from one end thereof with a substrate having electric wiring, which comprises a main body having a peripheral wall, a bottom wall and a top end opening to receive the one end of the lamp, and engaging segments and an insulating engaging flange protruding from the outer periphery of the peripheral wall of the main body and capable of holding the substrate therebetween, the improvement which comprises means for leading out the lead wires of the lamp with one end inserted in the main body from the main body through the bottom wall and fixedly holding part of the lead wires on a surface of the engaging flange which faces the engaging segments.

Since no metallic contacts are used and the lead wires of the baseless lamp are caused to extend over and fixed to the upper surface of the engaging flange, so that aforesaid socket for the baseless lamp may enjoy simple construction, and hardly be subject to any defective contact.

According to the preferred embodiment of the invention, the bottom wall of the main body is substantially thicker than the peripheral wall, so that the main body can be protected against deformation by heat and mechanical impact, thereby further minimizing the incidence of defective contact. Namely, the socket is mechanically and electrically connected with the wiring substrate by means of part of the lead wires between the engaging flange and the engaging segments, so that if the main body should be deformed, the space between the engaging flange and the engaging segments would be changed to loosen the socket on the substrate, damaging the contact between the wiring and the lead wires.

Figure 2:
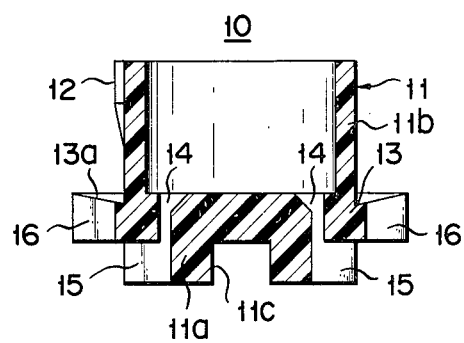
Figure 3:
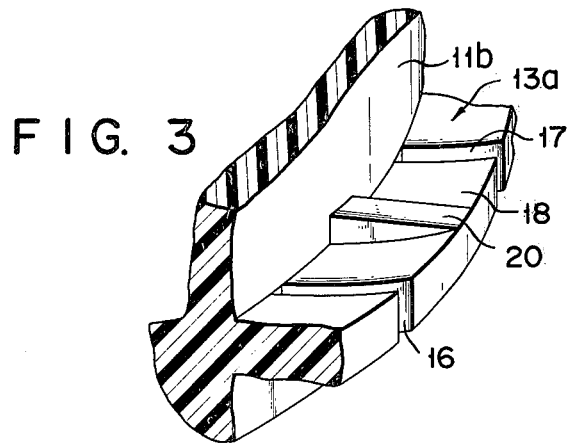
Figure 4:
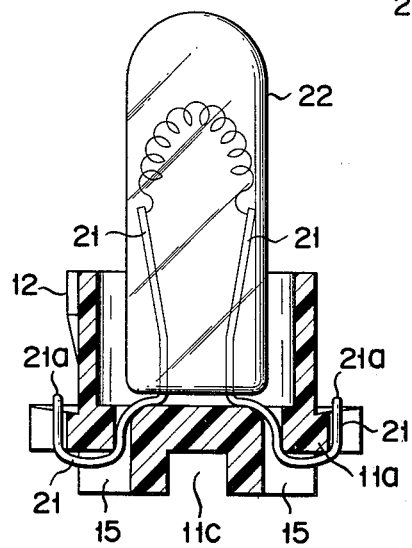
Figure 5:
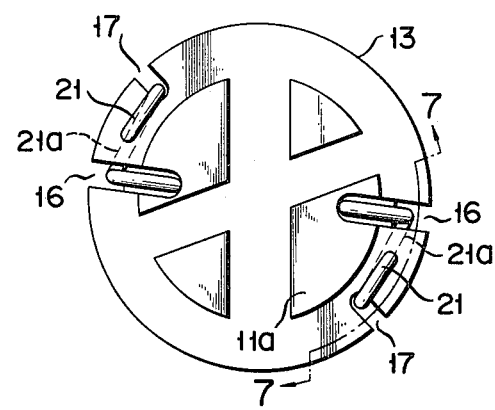
Figure 6:
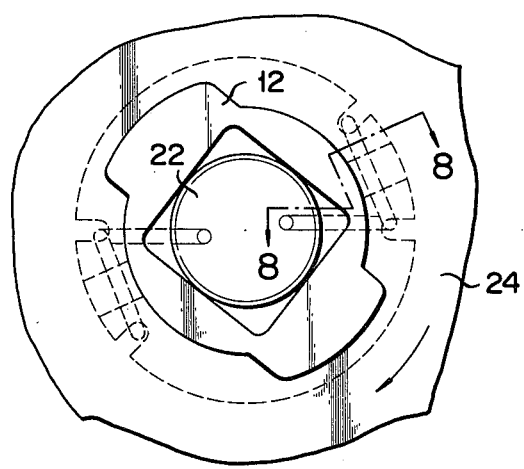
Figure 7:
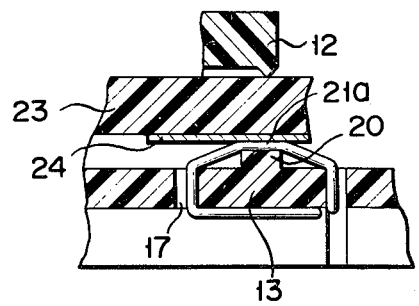
Figure 8:
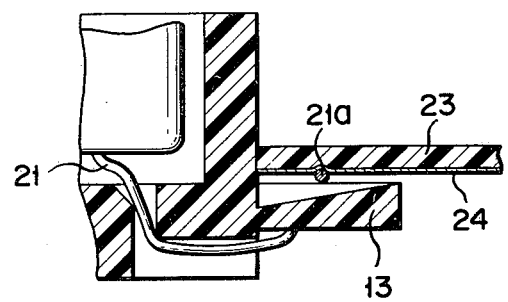
Figure 9:
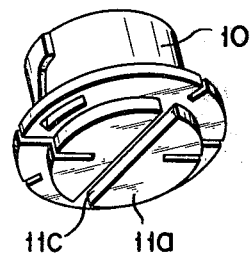

This invention can be more fully understood from the following detailed description when taken in conjunction with the accompanyings, in which:

FIGS. 1 to 8 show a socket for a baseless lamp according to an embodiment of this invention, wherein: FIG. 1 is a perspective overall view; FIG. 2 is a sectional view as taken along line 2—2 of FIG. 1; FIG. 3 is an enlarged perspective view of part of an engaging flange; FIG. 4 is a sectional view of the socket fitted with the baseless lamp; FIG. 5 is a bottom view of the socket of FIG. 4; FIG. 6 is a top view of the socket fixed to the printed substrate; FIG. 7 is a sectional view of the socket fixed to a printed substrate as taken along line 7—7 of FIG. 5; and FIG. 8 is an enlarged sectional view as taken along line 8—8 of FIG. 6; and FIG. 9 is a perspective view of a socket according to another embodiment of the invention.

Now there will be described a socket or lamp holder for a baseless lamp according to an embodiment of this invention with reference to the accompanying drawings.

Referring now to FIGS. 1 and 2, numeral 10 designates a socket which has a cylindrical main body 11 with an open top end. A bottom wall 11a of the main body 11 is substantially thicker than a peripheral wall 11b. On the under surface of the bottom wall 11a is a cross-shaped groove 11c in which a plus screwdriver is to be fitted. Around the peripheral wall 11b of the main body 11 are a pair of engaging segments 12 and an engaging collar or flange 13 facing and spaced from one another. These engaging segments 12 are located near the top opening of the main body 11, at an angular space of 180° from each other. As for the engaging flange 13, it is located at a substantial distance from the bottom end of the main body 11, an upper surface 13a of the flange 13 or the side facing the engaging segments 12 being substantially flush with the upper surface of the bottom wall 11a. The main body 11, engaging segments 12 and engaging flange 13 may be formed by integral molding of insulating synthetic resin.

In the bottom wall 11a of the main body 11 are a pair of wire ports 14 extending from the upper to the under surface thereof, spaced at a predetermined distance from each other. Further, in the under surface of the bottom wall 11a are a pair of first guide grooves 15 each having one end connected with each corresponding port 14 and the other end opening on the peripheral side of the bottom wall 11a under the engaging flange 13. In the under surface of the engaging flange 13 are a pair of second guide grooves 16 each having one end connected with each corresponding one of the first guide grooves 15 and the other end opening on the peripheral side of the flange 13. The other end of the second guide groove 16 opens also on the upper surface or side of the flange 13. On the peripheral side of the engaging flange 13 are a pair of fixing slits 17 arranged at regular distances respectively from the two second guide grooves 16 and extending from the upper to the under surface of the flange 13. Lead wire fixing regions 18 are defined on the upper surface of the engaging flange 13 between the second guide grooves 16 and their corresponding slits 17, respectively, as shown in FIG. 3.

The upper surface of the engaging flange 13 includes slopes tapered from the outer peripheral side toward the peripheral wall 11b. As shown in FIG. 3, these slopes are formed over the whole surface of the engaging flange 13 except part thereof so that portions of the fixing regions 18 protrude above the surfaces on both sides thereof to define projections 20.

Referring now to FIGS. 4 to 8, there will be described operating processes for electrically and mechanically connected a baseless lamp with an insulating substrate including a printed circuit by means of the socket of the above-mentioned construction.

As shown in FIG. 4, one end of a baseless lamp 22 with a pair of lead wires 21 outwardly extending from such one end is inserted into the main body through a top opening thereof. In doing this, the lead wires 21 are caused to project outward from the bottom wall 11a of the main body through the ports 14 bored in the bottom wall 11a. Then, the projected lead wires 21 are led successively along their corresponding first guide grooves 15, second guide grooves 16, fixing regions 18 and fixing slits 17, and the tip ends of the lead wires 21 are moored to their corresponding slits 17. Thus, respective portions of the lead wires 21, which constitute terminal portions 21a, are fixed on the projections 20 of the fixing regions 18. That is, the projected lead wires 21 are curved along their corresponding first and second guide grooves 15 and 16 to cause their tip ends to hang over the upper surface 13a of the engaging flange 13, curved along the upper surface 13a so as to extend over the fixing regions 18, again curved downward along the fixing slits 17 to be located under the engaging flange 13, and then so curved as to extend along the under surface of the engaging flange 13. FIGS. 4 and 5 show the state of the socket 10 fitted with the lead wires 21 in this manner.

Referring now to FIGS. 6 to 8, there will be described operating processes for electrically and mechanically connecting the socket thus fitted with the baseless lamp with the insulating substrate having a printed circuit arranged on one side or under surface thereof.

The socket 10 is inserted, with the baseless lamp 22 side forward, into an opening in an insulating substrate 23 such as a printed wiring board which is composed of a circular section with a diameter a little larger than the outside diameter of the main body 11 of the socket 10 and rectangular sections opening into the circular section and having enough dimensions to pass the engaging segments 12, until the substrate 23 is reached by the upper surface 13a of the engaging flange 13. Then, the socket 10 is turned in the arrowed direction of FIG. 6 by rotating the cross-shaped groove 11c by means of a plus screwdriver, thereby holding the insulating substrate 23 tight between the engaging flange 13 and the engaging segments 12. Namely, the socket 10 is fixed to the insulating substrate 23 according to the bayonet system. Consequently, as shown in FIGS. 7 and 8, the terminal portions 21a of the lead wires 21 fixed partially projecting by the projections 20 on the upper surface of the engaging flange 13 are brought in electrical contact with a printed circuit 24 on the under surface of the insulating substrate 23.

Although in the socket of the above-mentioned embodiment the cross-shaped groove is formed on the under surface of the bottom wall 11a of the main body for the rotary setting of the main body 10, a straight groove 11c may otherwise be formed to provide facility for minus-screwdriver setting, as shown in FIG. 9. Such groove is not always needed, and it is necessary only that the main body may be rotated relatively to the substrate by hand or by means of any suitable tool.

Moreover, the means for leading the lead wires of the baseless lamp to the outside of the main body is not limited to the combination of the ports and first guide grooves in the bottom wall and the second guide grooves in the engaging flange. Instead of using the second guide grooves, for example, there may be used ports extending from the under surface to the upper surface of the engaging flange. Likewise, the fixing slits on the peripheral side of the engaging flange for mooring the end portions of the lead wires may be replaced by ports piercing the engaging flange, for example.

What we claim is:

1. A socket for electrically and mechanically connecting a baseless lamp having lead wires extending therefrom at one end thereof with a substrate having electrical conductors thereon comprising:

a generally cylindrically-shaped main body, open at the top end thereof for receiving the one end of the baseless lamp, having a peripheral wall, and a bottom wall thicker than the peripheral wall;

an engaging segment and an insulating engaging flange integrally formed with the main body and protruding from the outer periphery of the peripheral wall thereof for engaging the substrate therebetween when the body and engaging segment are rotated in a predetermined direction with respect to the substrate, the flange having upper and lower surfaces;

wire ports piercing the bottom wall of the main body for receiving the lead wires of the lamp and providing a means for threading the lead wire from the inside of the main body to the outside of the bottom wall thereof;

a first guide groove in the bottom wall, associated with each wire port, for receiving a lead wire threaded therethrough and providing a means for threading the lead wire to the outer edge of the bottom wall;

a second guide groove, in the edge of the flange associated with each first guide groove, for receiving a lead wire threaded therethrough and providing a means for threading the lead wire to the upper surface of the flange; and a fixing slit in the edge of the flange, associated with each second guide groove and positioned a predetermined distance from its associated guide groove along the flange, for receiving a lead wire threaded through its associated second guide groove and along the upper surface of the flange in a direction opposite to that of the predetermined direction for rotating the body, engaging segment and flange for engaging the substrate, the fixing slit providing a means for threading the lead wire to the lower surface of the flange so as to secure the tip end of the lead wire.

2. A socket according to claim 1, wherein said upper surface of said engaging flange includes inwardly tapered sections and projections defined between said tapered sections, said lead wires threaded therethrough being fixed on said projections.

3. A socket according to claim 2, wherein said bottom wall has an under surface with a cross-shaped groove formed thereon.

4. A socket according to claim 2, wherein said bottom wall has an under surface with a straight groove formed thereon.

5. A socket according to any one of claims 2, 3, 4 or 1 wherein said main body, engaging segments, and engaging flange are formed by integral molding of synthetic resin.

* * * * *